(12) United States Patent
Chang et al.

(10) Patent No.: US 8,319,336 B2
(45) Date of Patent: Nov. 27, 2012

(54) REDUCTION OF ETCH MICROLOADING FOR THROUGH SILICON VIAS

(75) Inventors: Hung-Pin Chang, Taipei County (TW); Chen-Hua Yu, Hsinchu (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 112 days.

(21) Appl. No.: 12/832,184

(22) Filed: Jul. 8, 2010

(65) Prior Publication Data

US 2012/0007132 A1 Jan. 12, 2012

(51) Int. Cl.
*H01L 23/34* (2006.01)
(52) U.S. Cl. .................. 257/718; 257/720
(58) Field of Classification Search .......... 257/99, 257/718, 720
See application file for complete search history.

(56) References Cited

U.S. PATENT DOCUMENTS

| | | | |
|---|---|---|---|
| 4,074,342 A * | 2/1978 | Honn et al. .................. 361/779 |
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,855,397 B2 * | 12/2010 | Alley et al. ................ 257/99 |
| 2006/0131732 A1 * | 6/2006 | Nah et al. .................. 257/706 |
| 2007/0108461 A1 | 5/2007 | Shiraishi et al. |
| 2010/0127299 A1 * | 5/2010 | Smith et al. ................ 257/99 |
| 2010/0140790 A1 * | 6/2010 | Setiadi et al. .............. 257/698 |
| 2011/0215360 A1 * | 9/2011 | Wang .......................... 257/99 |

* cited by examiner

*Primary Examiner* — Thao P. Le
(74) *Attorney, Agent, or Firm* — Lowe Hauptman Ham & Berner, LLP

(57) ABSTRACT

The patterns (or layout), and pattern densities of TSVs described above provide layout of TSVs that could be etched with reduced etch microloading effect(s) and with good within-die uniformity. The patterns and pattern densities of TSVs for different groups of TSVs (or physically separated groups, or groups with different functions) should be fairly close amongst different groups. Different groups of TSVs (or TSVs with different functions, or physically separated TSV groups) should have relatively close shapes, sizes, and depths to allow the aspect ratio of all TSVs to be within a controlled (and optimal) range. The size(s) and depths of TSVs should be carefully selected to optimize the etching time and the metal gap-fill time.

20 Claims, 8 Drawing Sheets

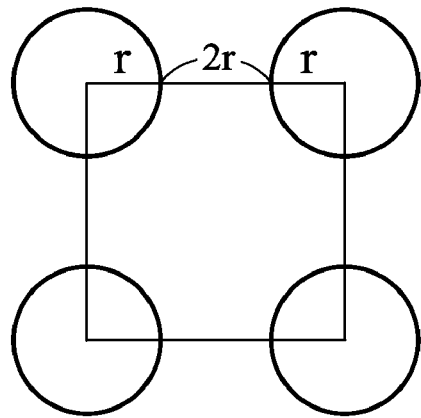
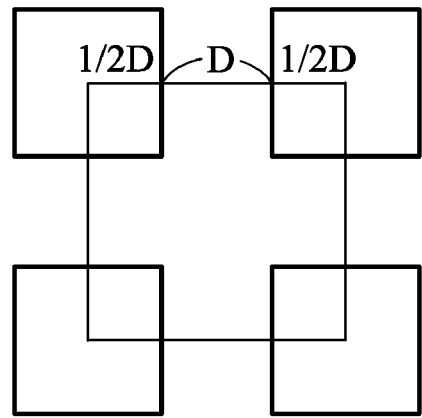
FIG. 5A
FIG. 5B
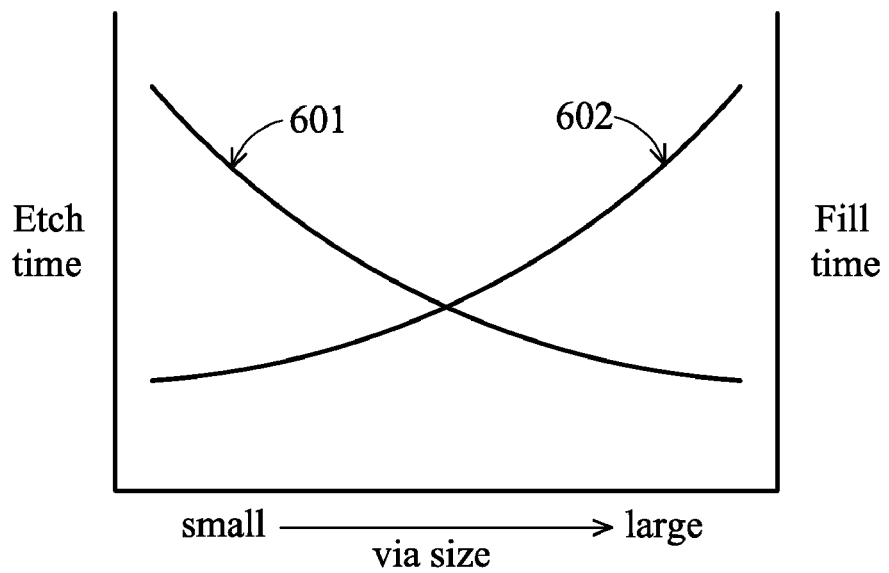
FIG. 6

REDUCTION OF ETCH MICROLOADING FOR THROUGH SILICON VIAS

RELATED APPLICATIONS

The present application is related to provisional U.S. Application No. 61/320,819, entitled "Novel Semiconductor Package With Through Silicon Via," filed on Apr. 5, 2010, which is incorporated herein by reference in its entirety.

FIELD

This application relates to etch of through silicon vias and, more particularly, to reducing etch microloading of through silicon vias.

BACKGROUND

The trend in advanced semiconductor packaging has been to reduce the form factor while improving electrical performance. This enables the creation of products for industry and consumers that are faster, cheaper and smaller. Through silicon vias (TSVs), or more accurately through silicon plugs (TSPs), provide an approach to achieve higher levels of integration and form factor reduction for advanced semiconductor packaging. As the name implies, the electrical connection of the back and front of a semiconductor device enables the possibility of vertically assembling multiple chips in a package where previously only one chip was present. Accordingly, more semiconductor devices can be integrated into a smaller form factor. In addition, different types of semiconductor chips can be also integrated in a single package to create a so-called system in a package (SIP). Irrespective of the approach, the footprint of multiple packages in the printed circuit board is reduced, which also reduces final product cost. Finally, interconnecting the chips by using TSVs can decrease the number of electrical connections necessary to the substrate [unit], because one substrate connection can service multiple chips. This also helps to simplify the assembly process and improve yield.

Silicon etch is a key process in TSV fabrication, since it is used to create deep TSVs in silicon substrates. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

FIG. 5A shows an arrangement of TSVs, in accordance with some embodiments.

FIG. 5B shows another arrangement of TSVs, in accordance with some embodiments.

FIG. 6 shows a diagram of TSV etching time and gap-fill time as a function of via size, in accordance with some embodiments.

DETAILED DESCRIPTION OF THE EXEMPLARY EMBODIMENT

Figure 1:
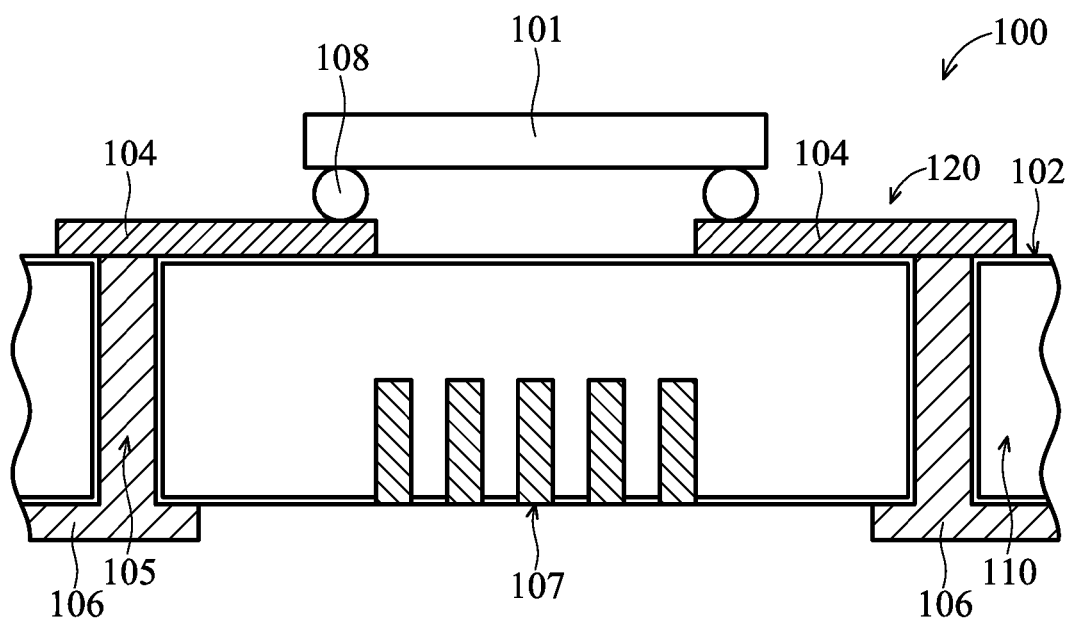
FIG. 1 (Prior Art) shows a cross-sectional view of a package for a semiconductor chip, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 (Prior Art) shows a cross-sectional view of a package 100 for a semiconductor chip 101, in accordance with some embodiments. Package 100 includes a support structure (or package structure) 120, which is made on a Si substrate 110. Structure 120 is used to support semiconductor chip 101 and to provide electrical connection between the semiconductor chip 101 and a mounting substrate (not shown), such as a printed circuit board (PCB), under support structure 120. In addition to providing electrical connection, the support structure 120 may also provide means for assisting heat dissipation, such as thermal trenches/vias 107, of heat generated by semiconductor chip 101.

The support structure 120 includes insulating layers 102 formed on top and bottom surfaces of the Si substrate 110 and sidewalls of through silicon vias (or plugs) 105. The support structure 120 also includes a number of upper electrical contacts 104 formed above substrate 110 and a number of lower electrical contacts 106 formed below substrate 110. The semiconductor chip 101 is connected to the upper electrical contacts through connecting elements 108, such as solder balls. The through silicon vias 105 are filled with a conductive material(s) to provide electrical connection between the semiconductor chip 110 and a mounting substrate (not shown), which provides electrical connection to other components, such as power source and other components. The support structure 120 further includes a number of thermal trenches/vias 107, which are formed on the side of Si substrate 110 that is away from the semiconductor chip 101. The thermal trenches/vias 107 are also filled with a thermal conductive material(s), such as a metal, to assist or to enhance heat dissipation of heat generated by semiconductor chip 101 that has been transferred to substrate 110. As shown in FIG. 1, the thermal trenches/vias 107 are not electrically connected to semiconductor chip 101.

Although the support structure 120 can provide the function of electrical connection and heat dissipation for the semiconductor chip 101, its manufacturing process is cumbersome. Since the through silicon vias 105 and thermal trenches/vias 107 have different depths, etching of these two types of vias requires two separate photoresist patterning processes and two etching processes. In addition, the thermal dissipation capability of thermal trenches/vias 107 is limited by the silicon material between the thermal trenches/vias 107 and electrical contact areas 104. The thermal conductivity of silicon is lower than thermal conductivity of a metal. Therefore, the heat dissipation capability of silicon is not as good as the metal-filled thermal trenches/vias 107.

Therefore, it is desirable to have thermal trenches/vias, such as thermal trenches/vias 107, that have the same depth as the electrical TSVs 105. If thermal trenches/vias 107 and the electrical TSVs 105 have the same depth, only one single photoresist patterning process and one single etching process are required to create the vias/trenches, instead of two separate processes for both pattering and etching. In addition, heat dissipation of through silicon vias (TSVs) would be better than thermal trenches/vias that do not utilize the entire depth of the silicon substrate, such as thermal trenches/vias 107 of FIG. 1.

Through silicon vias (TSVs) or through silicon plugs (TSPS) can be created by dry silicon etching processes. Through silicon vias can have depth in the range of several hundred microns; therefore, dry silicon etching processes (or deep silicon etching processes) used to etch TSVs (or TSPS) are deep reactive ion etching (DRIE) processes. DRIE processes are used to fabricate silicon microsystem components or microelectromechanical systems (MEMS). The DRIE processes for creating TSVs etch silicon anisotropically to create vertical walls of TSVs.

In some embodiments, silicon DRIE process may use fluorine radicals (F*) in a plasmarized fluorine-containing gas, such as $SF_6$, to etch silicon. Equation (1) shows the generation of fluorine radicals (F*) from the exemplary fluorine-containing gas, $SF_6$, in a plasma environment.

$$SF_6 \rightarrow SF_M + NF^* \quad (1)$$

wherein M+N=6. The fluorine radicals (F*) then react with silicon to form $SiF_4$, as shown in Equation (2) below.

$$Si + 4F^* \rightarrow SiF_4 \quad (2)$$

The gaseous $SiF_4$ then leaves the substrate surface after its formation. To etch through silicon vias (TSVs), the etching process should be highly anisotropic. Anisotropic etch can be achieved by sidewall passivation or by forming polymers on the sidewalls. In some embodiments, one or more passivation gas, such as $O_2$, $Cl_2$, or HBr, can be added to the etching gas to provide side-wall passivation. In some other embodiments, fluro-carbon gas, such as $C_4F_8$, can be added to the etching gas to form polymers to protect side walls of TSVs during etching.

The silicon DRIE process may have a number of process parameters, such as pressure, gas flow rates, process power, etc., that affect the process results. In addition to the process parameters, a number of factors to the geometries or patterns of openings to be etched may also influence the etch depth and other process characteristics. The effects can be grouped in die-to-die effects and within-die effects. The die-to-die effects include spatial across-wafer etch rate variations induced by the chamber geometry and process gas introduction. The die-to-die effects are called macroloading effects, which are caused by differences in reactive species across the substrate. The within-die effects are called microloading effects, which may include aspect ratio dependent etching, which is an etch rate reduction caused by a reduced transport of reactive species in deep and narrow structures. Microloading effects may also include an etch rate reduction caused by a local depletion of reactive species within dies as a result of high opening densities. High opening density areas have high reactant consumption rates. Since the transport of etching species across the wafer is limited by diffusion processes, concentration variations can be sustained over a certain length scale, which is called a "depletion radius." Such depletion leads to reactant deficits and decreased etch rates in high opening density areas.

Figure 2A:
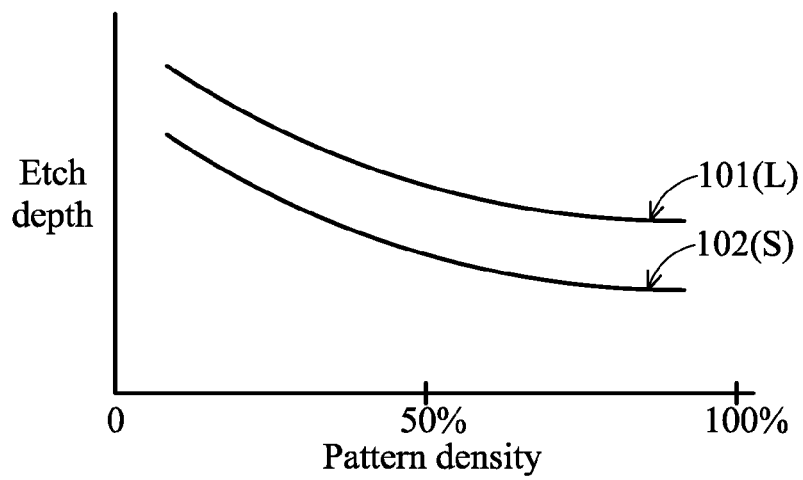
FIG. 2A shows a diagram of etch depth as a function of pattern density, in accordance with some embodiments.

FIG. 2A shows a schematic diagram of etch depths as a function of pattern density, in accordance with some embodiments. Curve 101 illustrates the etch depths after a certain period of etch time ("T") for various pattern densities for openings with a particular size (size "L") and shape. In some embodiments, the depths of the TSVs are between about 30 µm to about 400 µm. Here, the pattern density is defined as percentage of surface areas of openings to the total substrate surface areas. For example, a 50% pattern density means 50% of substrate surface areas is occupied by openings. Curve 101 shows that as pattern density increases, etch depths decrease as a result of reactant depletion.

Figure 2B:
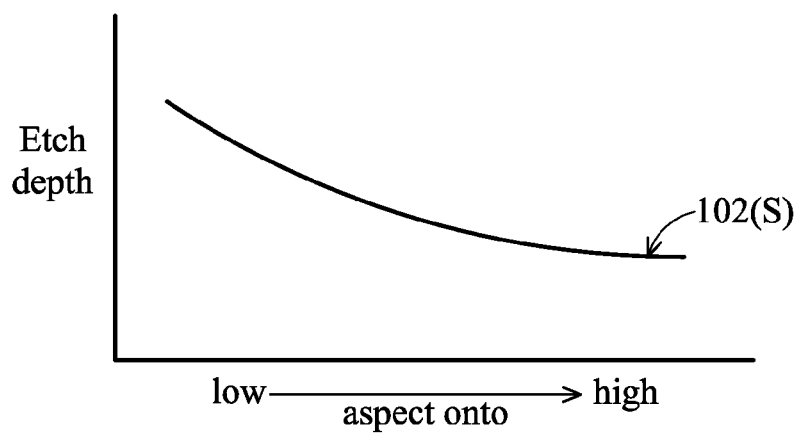
FIG. 2B shows a diagram of etch rate as a function of aspect ratio, in accordance with some embodiments.
Figure 2C:
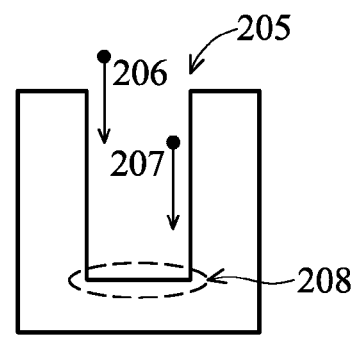
FIG. 2C shows a via with a width "W" and a depth "D", in accordance with some embodiments.

FIG. 2A also shows another curve 102, which illustrates the etch depths for openings of another particular size (size "S") and shape. The size of openings (S) of curve 102 is smaller than the size of openings of curve 101. Curve 102 lies below curve 101. This means that for a particular pattern density, openings with smaller size are etched more slowly than opening with larger size. This could be explained by the effect of aspect ratio. FIG. 2B shows a diagram of etch rate as a function of aspect ratio, in accordance with some embodiments. FIG. 2C shows a via 205 with a width "W" and a depth "D", in accordance with some embodiments. The aspect ratio of via 205 is defined as D/W. It's harder for reactants, such as reactants 206 and 207, to reach areas deep in via 205, such as area 208. Therefore, etch rates are lower when the aspect ratios are high, as shown in FIG. 2B. As mentioned above, the size of the openings in curve 102 is smaller the size of openings in curve 101. Therefore, curve 102 is below curve 101, as shown in FIG. 2A. In some embodiments, the aspect ratios of the TSVs are between about 2 to about 25. In some embodiments, the aspect ratios of the TSVs are between about 3 to about 10.

Figure 3A:
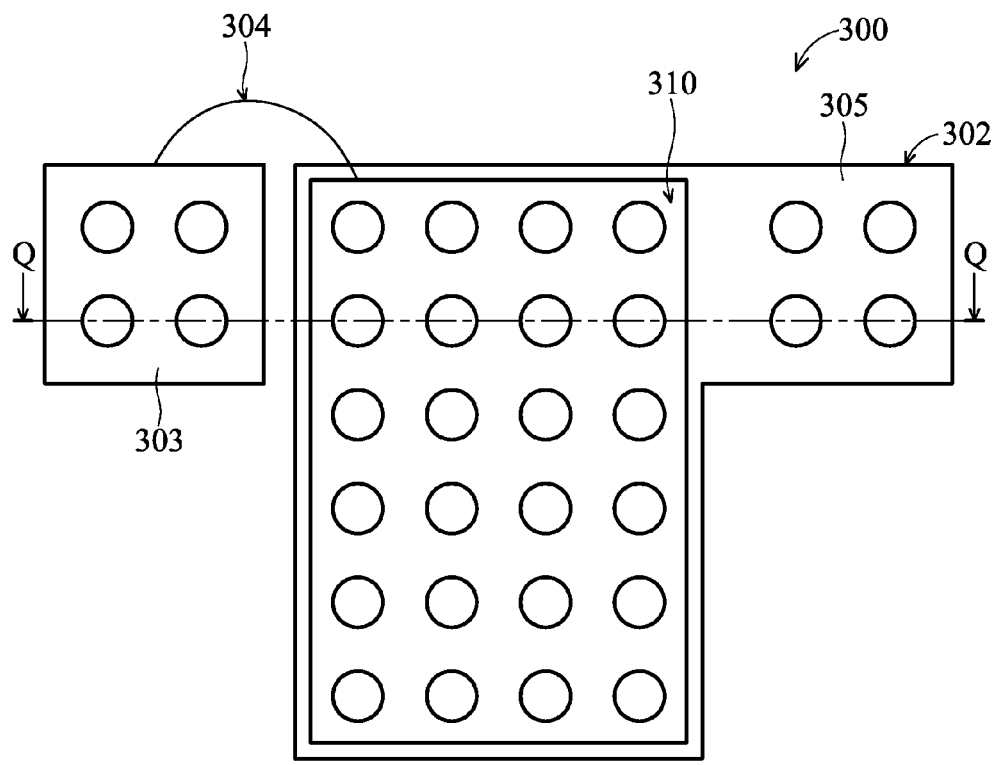
FIG. 3A shows a top view of a package of a light-emitting device (LED), in accordance with some embodiments.
Figure 3B:
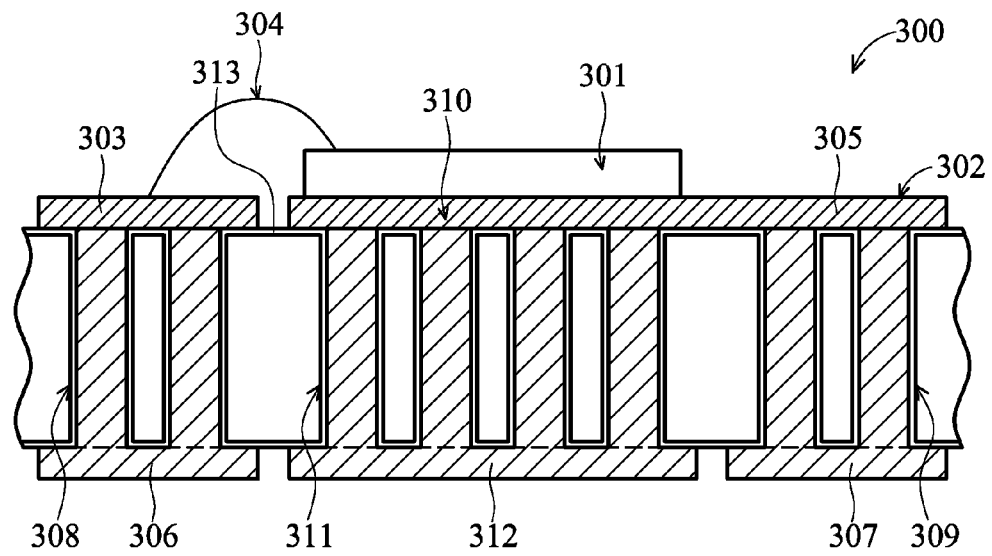
FIG. 3B shows a cross-sectional view of package of FIG. 3A, in accordance with some embodiments.

FIG. 3A shows a top view of a package 300 of a light-emitting device (LED) 301 (a semiconductor device), in accordance with some embodiments. FIG. 3B shows a cross-sectional view of package 300 of FIG. 3A (cut along line QQ), in accordance with some embodiments. As shown in FIGS. 3A and 3B, LED 301 is placed on a package structure 302, which provides the function of electrical connection and heat dissipation. LED 301 is connected to a P-contact (or P-electrode) 303 through a (metallic) wire 304. LED 301 is also connected to a N-contact (or N-electrode) 305. The N-contact 305 and P-contact 303 are electrically connected to electrical interfaces 307 and 306, which are on the other side of package structure 302 and are connected with package structure 302 through TSVs 309 and 308 respectively. In some embodiments, the electrical interfaces 306 and 307 are filled with the same material(s) as the TSVs 308 and 309, and are extended above the TSVs 308 and 309.

LED 301 is placed on an interfacial area 310, which is an extension of P-contact 305, in some embodiments. Electrical interfaces 306 and 307 are connected to a substrate, such as a printed circuit board (PCB) (not shown), with electrical connections and also possibly other electrical components.

The heat generated by LED 301 is dissipated with the help of TSVs 311 under the interfacial area 310. TSVs 311 are connected to a thermal interface 312, which could thermally connected to one or more thermal components on the substrate, such as the PCB mentioned above. The thermal interface 312 is thermally connected to package structure 302 through TSVs 311. In some embodiments, the thermal interface is filled with the same material(s) as the TSVs 311, and is extended above TSVs 311.

In some embodiments, all TSVs are insulated from one another by a lining dielectric layer 313. In some embodiments, the TSVs 308, 309, and 311 are filled with conductive materials, such as W, Al, or Cu. In some embodiment, the TSVs are lined with a barrier layer and/or an adhesion-promoting layer (not shown) before the deposition of the conductive material. The barrier layer and/or adhesion-promoting layer deposited depend on the conductive material used to fill the TSVs. In some embodiment, the barrier and/or adhesion-promoting layers are made of Ti, TiN, Ta, TaN, or a combination of the above-mentioned films.

Figure 3C:
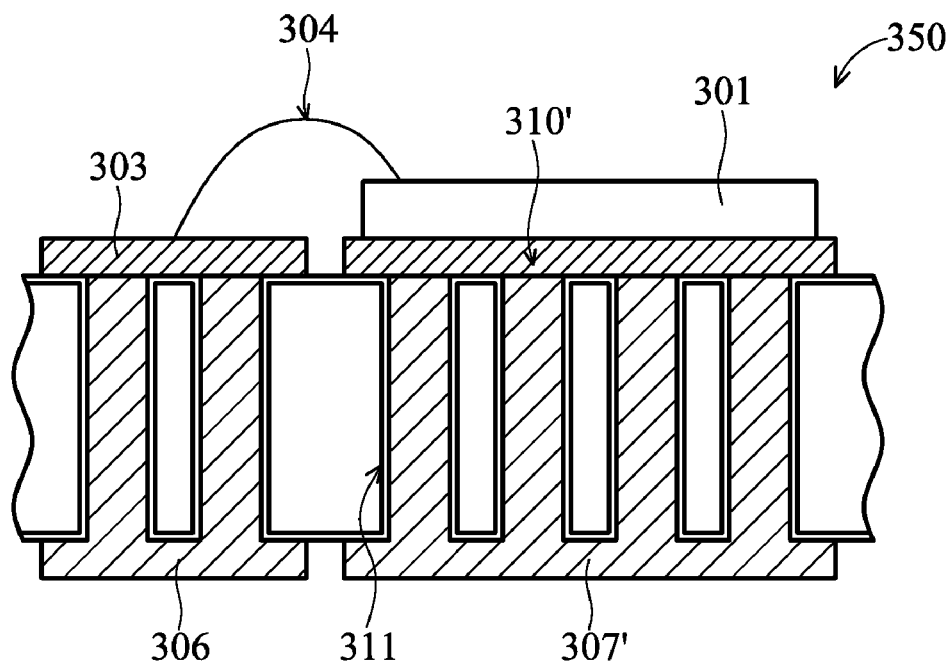
FIG. 3C shows a cross-sectional view of an LED package, in accordance with some embodiments.

In the embodiment shown in FIGS. 3A and 3B, the N-contact 305 is electrically connected to TSVs 309, which are physically separated from the thermal TSVs 311. In some embodiments, the thermal TSVs 311 can also function as electrical TSVs and separate TSVs 309 are not needed. FIG. 3C shows a cross-sectional view of an LED package 350, where the electrical TSVs for N-contact and thermal TSVs are combined, in accordance with some embodiments. As shown in FIG. 3C, the N-contact 305 and the interfacial area 310 overlaps and become one area 310'. The thermal interface and the electrical interface 307 also merge into one single interface 307', which provide both electrical connection and thermal connection to other element(s) on the substrate, such as the above mentioned PCB (not shown). The TSVs 309 of FIG. 3B no longer exists. The TSVs 311' provides both electrical connection and thermal conduction.

Figure 3D:
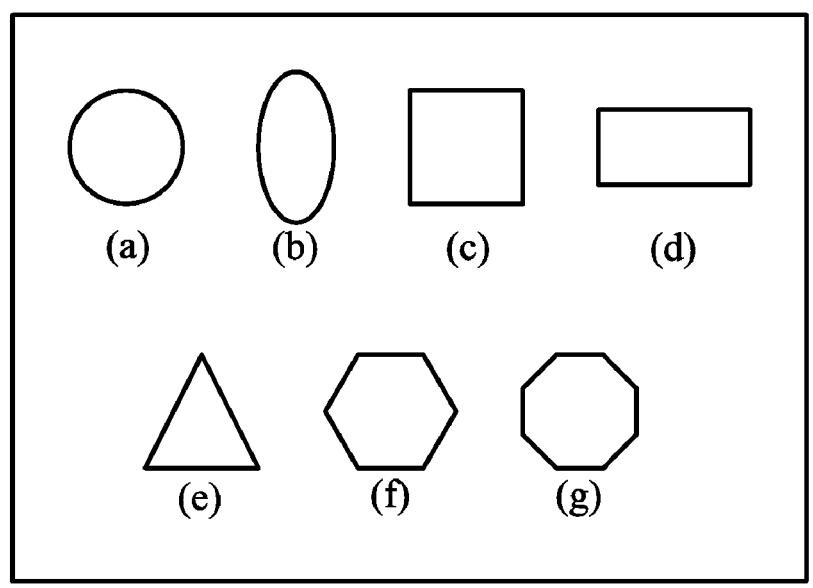
FIGS. 3D(a)-(g) shows various shapes of cross-sections of individual TSVs, in accordance with some embodiments.

In FIGS. 3A and 3B, the heat generated from LED chip 301 is dissipated through TSVs 311 that are similar to the electrical connection TSVs 308 and 309. Since the TSVs 311 and TSVs 308, 309 have the same depth, the manufacturing process can be simplified. Only one single via (or plug) patterning and one single via (or plug) etching are needed. As mentioned above, to achieve good via (or plug, or trench) etching, there are concerns related to microloading that need to be addressed. To reduce microloading affects, TSVs 311 for heat dissipation should have size(s) and shape(s) that closely resemble those of electrical TSVs 308 and 309, in some embodiments. FIGS. 3D(a)-(g) show various shapes of cross-sections of TSVs, in accordance with some embodiments. As shown in FIGS. 3D(a)-(g), the shape could be a circle (a), an oval (b), a square (c), a rectangle (d), a triangle (e), a hexagon (f), an octogon (g), etc. By allowing the electrical TSVs to have shapes and sizes closely resemble those of thermal TSVs, the aspect ratios of these two types of vias (electrical and thermal) can be kept at the same range during and at the end of etching to prevent one type of vias having higher or lower aspect ratio than the other type of vias.

Figure 4A:
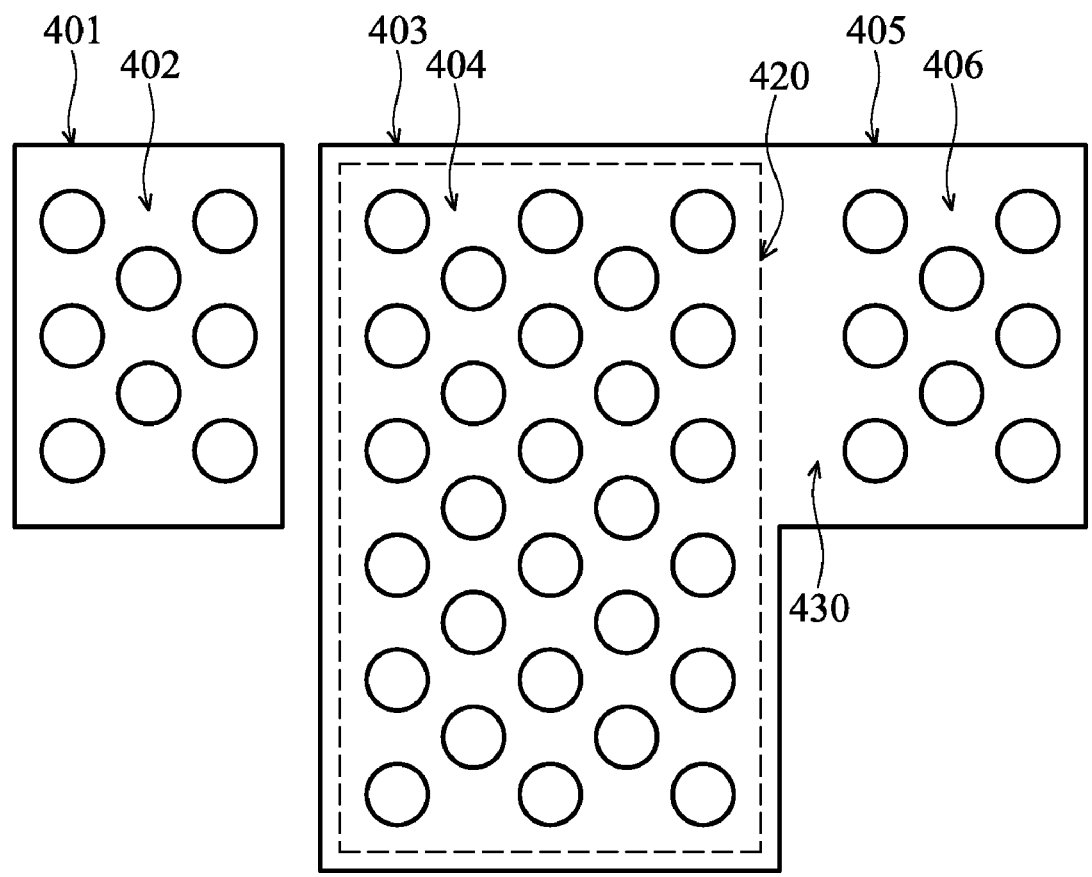
FIGS. 4A-4C shows various arrangements of TSVs in a package for an LED, in accordance with some embodiments.
Figure 4B:
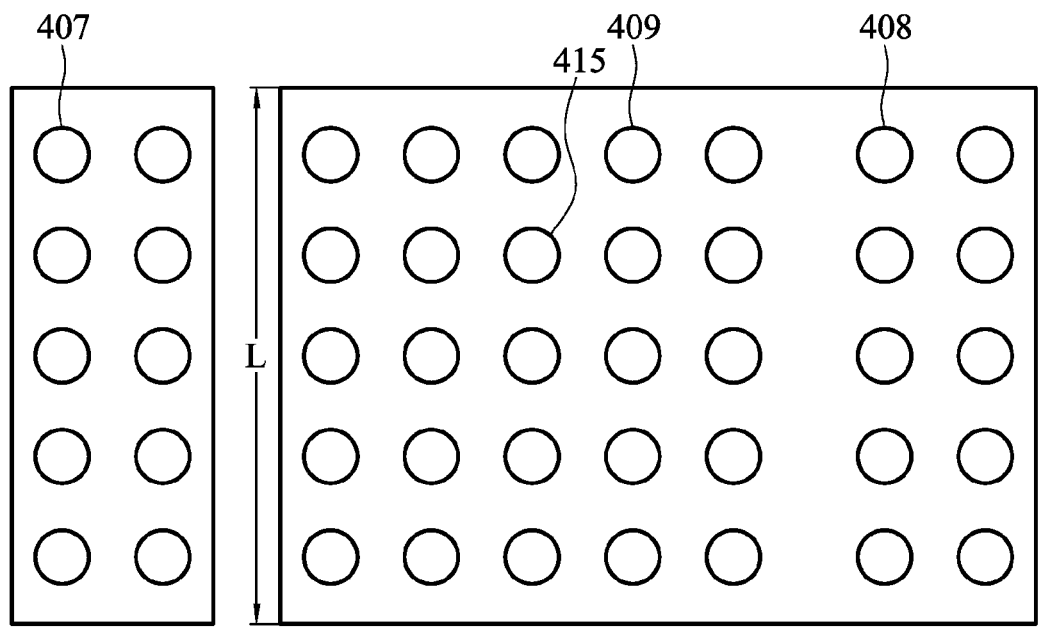
Figure 4C:
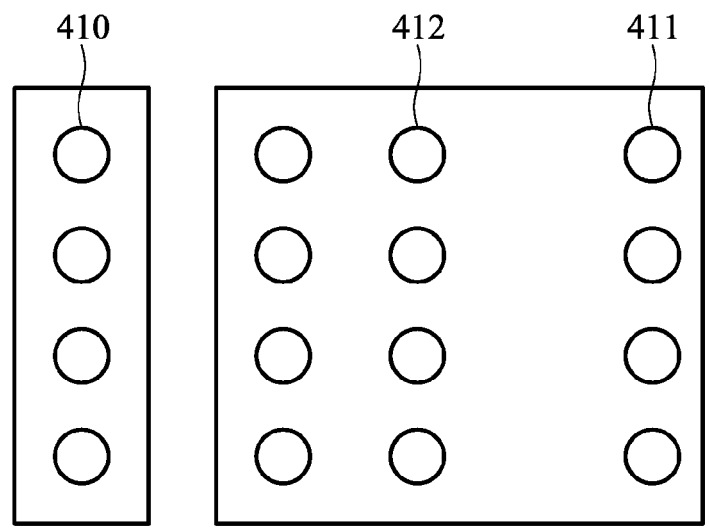

In addition, the densities of the thermal and electrical vias are in the same range, in accordance with in some embodiments. FIGS. 3A and 3B show that the thermal vias 311 and the electrical vias 308 and 309 are arranged in the same pattern and having the same density. Such arrangement reduces the difference in microloading effects between these two types of vias, which makes the process optimization easier. FIGS. 3A and 3B show only one example of how the vias can be arranged. Other arrangements are also possible. FIG. 4A shows that the TSVs in different columns of thermal and electrical TSVs are staggered, in accordance with some embodiments. For example, electrical vias in columns 401 and 405 are staggered with electrical vias in columns 402 and 406 respectively. Thermal vias in column 403 are staggered with thermal vias in column 404. FIG. 4B shows that the columns of electrical TSVs 407 and 408 extend to the same length "L" as the columns of thermal vias, in accordance with some embodiments. FIG. 4C shows the electrical TSVs 410 and 411 are arranged in single columns, in accordance with some embodiments. To allow the pattern densities of electrical TSVs 410 and 411 to have pattern densities close to the pattern density of thermal TSVs 412, the thermal TSVs 405 (shown as thermal TSVs 412 here) are arranged farther apart between columns, in comparison to other arrangements described above (such as the thermal TSVs of FIGS. 3A-3C, and 4A-4B). Different modification to layouts of electrical and thermal TSVs can be made to increase the similarity of patterns and pattern densities of these two types of vias (thermal and electrical).

FIG. 5A shows an arrangement of TSVs, in accordance with some embodiments. The radius of TSV 501 is "r" and the distance between two closest TSVs is "2r" (or the diameter of the TSV). The pattern density of TSVs in FIG. 5A is about 20% (or more specifically 19.6%). FIG. 5B shows another arrangement of TSVs, in accordance with some embodiments. The TSVs are in square shape and have a width of "D". The distance between two closest TSVs is also "D". The pattern density of TSVs in FIG. 5B is 25%. In some embodiments, the pattern density is calculated as the area occupied by the TSVs divided by the area in the vicinity of the TSVs, not percentage of the entire substrate surface area. For example, the pattern density of thermal vias in FIG. 4A is calculated by dividing the cross-sectional areas of thermal vias, such as vias in columns 403 and 404, by the area 420 (enclosed by dotted line), not by the entire area 430 (L-shape area). In some embodiments, the TSV density is between about 0.1% to about 70%. In some other embodiments, the TSV density is between about 25% to about 60%.

Since the number of thermal TSVs is likely to be more than the number of electrical TSVs, the pattern of electrical TSVs in the examples shown in FIGS. 3A-3C, and FIGS. 4A-4C are more likely to be affected by edge effect than the thermal TSVs. The edge effect described here refers to TSVs at the edges of the TSV patterns and can be called "pattern edge effect." For example, the electrical TSV 407 of FIG. 4B is affected more by the edge effect than thermal TSV 415 in the same figure. The effective pattern density for TSVs at the pattern edges, such as TSV 407, would be less than the effective pattern density of TSVs away from the pattern edges, such as TSV 415. In some embodiments, pattern density (calculated) of electrical vias (or a group of vias with smaller total number) is higher than pattern density of thermal vias (or a group of vias with larger total number) by between about 0.1% to about 5%.

In some embodiments, the difference between the pattern density of thermal vias and the pattern density of electrical vias is between about 0% (same pattern density) to about 10%. In some other embodiments, the difference in pattern density of thermal vias and electrical vias is between about 0% to about 2%. In yet some other embodiments, the difference in pattern density of thermal vias and electrical vias is between about 0% to about 5%. The difference in pattern density can be a result of difference in shapes, sizes, or arrangements of TSVs. The pattern density of thermal vias can be higher or lower than the electrical vias.

As mentioned above, some thermal vias play dual roles and also function as electrical vias. In the statement above regarding TSV densities, the thermal vias refer to vias that have the function of being thermal vias, such as vias 311, 409, and 415. However, such thermal vias can also have the function of being electrical vias, such as vias 311 of FIG. 3C. In contrast, the electrical vias described above for pattern density refer to vias that only functional as electrical vias, such as vias 308, 309, 407, and 408.

Due to the concern of pattern edge effects, it is desirable to have more TSVs with smaller diameters (or widths) to reduce pattern edge effect, in some embodiments. In addition, for larger TSVs, the metal filling of TSVs would take longer. However, if the size of the TSVs are too small, the aspect ratios of the TSVs are higher, which could greatly reduce the etch rate. FIG. 6 shows a diagram of TSV etching time and gap-fill time as a function of via size, in accordance with some embodiments. Curve 601 shows that via (or TSV) etch time decreases with increasing via size and curve 602 shows via metal filling time increases with increasing via size. The optimal via size is neither too large nor too small. In some embodiments, the diameter of vias is between about 5 μm to about 50 μm. In some other embodiments, the diameter of vias is between about 15 μm to about 40 μm.

Figure 7:
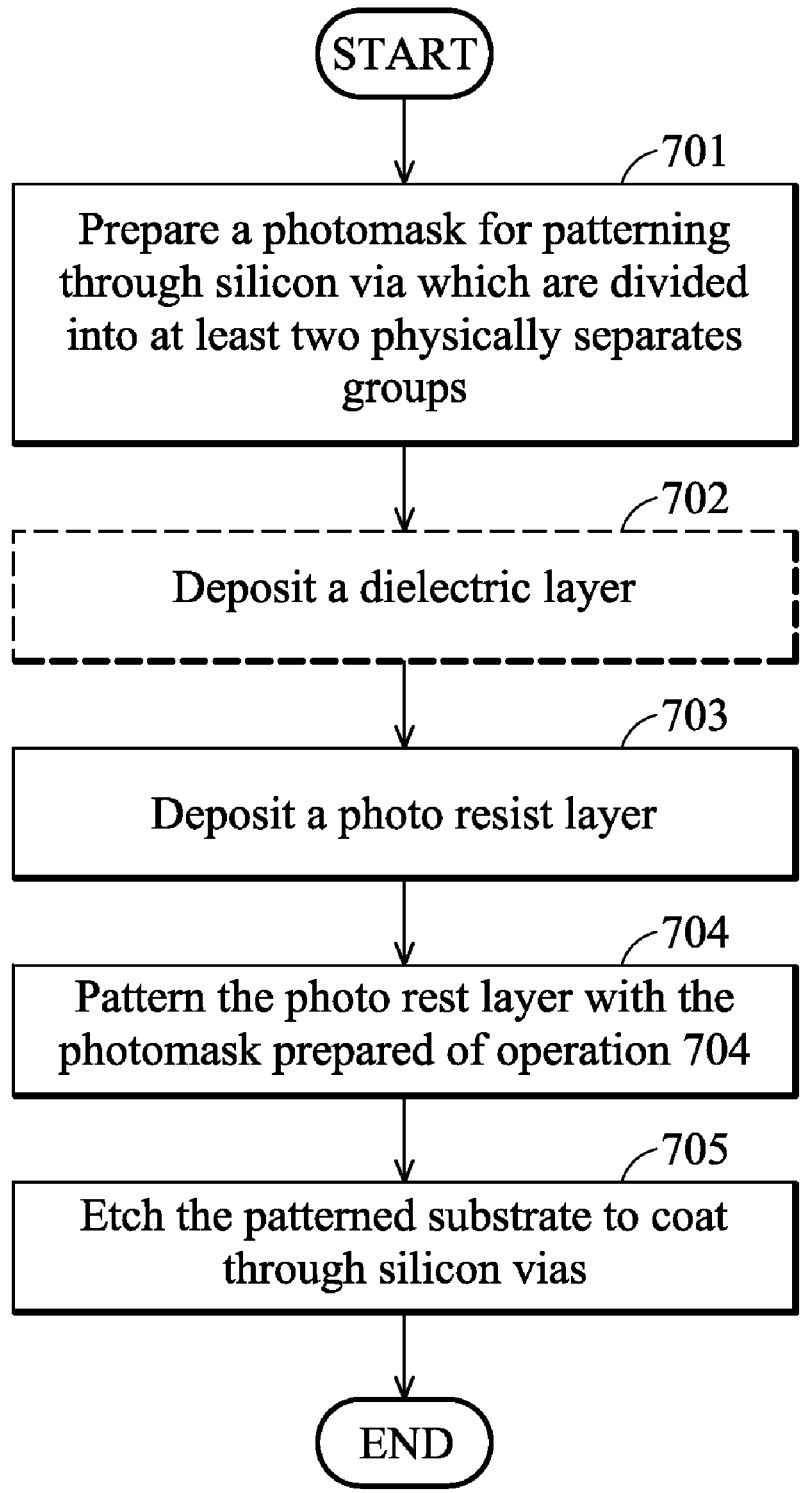
FIG. 7 shows a process flow of patterning and etching TSVs on a substrate, in accordance with some embodiments.

FIG. 7 shows a process flow 700 of patterning and etching TSVs on a substrate, in accordance with some embodiments. At operation 701, a photomask is prepared with patterns of TSV openings on the photomask. The TSVs are divided into at least two separate groups, such as thermal TSVs and electrical TSVs. In some embodiments, the TSVs are for electrical connection and/or thermal dissipation of semiconductor chips, such as LED chips. Other types of chips (non-LED chips) can also use the process flow 700 to create TSVs. In some embodiments, the thermal TSVs also provide electrical connection. The TSVs for thermal conduction and for electrical connection are designed to have about the same cross-sectional area. In some embodiments, the largest difference in cross-sectional areas for TSVs with different functions is within about 10%. In some embodiments, all TSVs have the same shape. In some other embodiments, the TSVs have different shapes. As mentioned above, the closeness of cross-sectional areas of all TSVs allows all TSVs to have aspect ratios that are roughly the same.

At operation 703, a photoresist layer is deposited on the substrate. In some embodiment, a dielectric layer is deposited on the substrate at an optional operation 702 before the deposition of the photoresist layer. The dielectric layer is used to protect surface of the substrate from either contamination from photoresist or from damage incurred during the via etching process. The dielectric layer is a dummy layer and needs to be removed after vias are etched.

In some embodiments, the photoresist layer is made of conventional photoresist, which is in liquid form and is deposited by a spin-on process. In other embodiments, the material of the photoresist layer is a dry film resist (DFR), which can also be patterned by photolithography (i.e. with light exposure). The DFR can be a positive or a negative photoresist. DFR has been used for creating patterns for copper plating for circuit boards. An example of DFR is MP112, made by TOK CO. LTD. of Japan. A DFR can be laminated on a substrate. Using dry film resist has an advantage over the wet spin-on photoresist that the dry film resist is only laminated on the substrate surface. In contrast, wet spin-on photoresist would flow into the via openings. Since the openings for through silicon vias (or trenches) are quite deep, such as between about 20 μm to about 300 μm, the wet photoresist filled inside could be hard to remove completely for copper to be properly plated on the sidewalls and bottom surfaces of the openings.

After the photoresist layer is deposited on the substrate, at operation 704 the photoresist layer is patterned by using the photomask prepared at operation 701, in accordance with some embodiments. As mentioned above, in order to reduce microloading, the via openings on the photomask are designed to have relatively close shapes and sizes, and with patterns and pattern densities that are also fairly close between different groups of vias, such as thermal vias (could also function as electrical vias) and electrical vias (functional purely as electrical vias and are not under semiconductor chips). In some embodiments, the size, shapes and pattern densities of vias are the same in the same die. In some embodiments, the pattern density of vias in the group with a smaller number of vias is slightly higher than the pattern density of vias in the group with a larger number of vias, such as between about 0.1% to about 5% higher.

After photoresist patterning, the substrate is etched by a dry silicon etch process at operation 705 to create TSVs, in accordance with some embodiments. With optimal design of via size, shape, pattern, and pattern density, the microloading effect of TSVs can be greatly reduced. In some embodiments, the depth of vias is between about 20 μm to about 300 μm. In some other embodiments, the depth of vias is between about 50 μm to about 200 μm.

After the TSV etching, other substrate processing sequences to complete the preparation of the substrate. Examples of the subsequent processing may include, but are not limited to, photoresist removal, cleaning, dielectric layer deposition, metal deposition, grinding of backside silicon to expose TSVs, etc. Details of exemplary structures and preparation methods of a substrate with TSVs are described in provisional U.S. Patent Application No. 61/320,819, entitled "Novel Semiconductor Package With Through Silicon Vias" and filed on Apr. 5, 2010, which is incorporated herein by reference in its entirety.

The patterns (or layout), and pattern densities of TSVs described above provide layout of TSVs that could be etched with reduced etch microloading effect(s) and with good within-die uniformity. The patterns and pattern densities of TSVs for different groups of TSVs (or physically separated groups, or groups with different functions) should be fairly close amongst different groups. Different groups of TSVs (or TSVs with different functions, or physically separated TSV groups) should have relatively close shapes, sizes, and depths to allow the aspect ratio of all TSVs to be within a controlled (and optimal) range. The size(s) and depths of TSVs should be carefully selected to optimize the etching time and the metal gasp-fill time.

In one embodiment, a package of a light-emitting device (LED) chip is provided. The package includes the LED chip, and a support structure. The LED chip is disposed on the support structure. The support structure has a first group of through silicon vias (TSVs) for providing electrical connection for the LED chip and a second group of TSVs for providing a function of heat dissipation for the LED chip. The first group of TSVs is arranged in a first pattern with a first pattern density and the second group of TSVs is arranged in a second pattern with a second pattern density. The first and the second groups of TSVs all have a same depth.

In another embodiment, a method of preparing for a support structure of a light-emitting device (LED) chip is provided. The method includes preparing a photomask for patterning through silicon vias (TSVs). The TSVs are divided into at least a first group and a second group. The first group of TSVs provides electrical connection for the LED chip and the second group of TSVs provides a function of heat dissipation for the LED chip. The first group of TSVs is arranged in a first pattern with a first pattern density and the second group of TSVs is arranged in a second pattern with a second pattern density. A difference between the first pattern density and the second pattern density is between about 0% to about 5%. The method also includes depositing a photoresist layer on a substrate for the support structure. The method further includes patterning the deposited photoresist layer on the substrate by using the prepared photomask, and etching the substrate by using a deep reactive ion etching process for silicon after the deposited photoresist layer is patterned.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A package of a light-emitting device (LED) chip, comprising
   the LED chip; and
   a support structure, wherein the LED chip is disposed on the support structure, and wherein the support structure has a first group of through silicon vias (TSVs) for providing electrical connection for the LED chip and a second group of TSVs for providing a function of heat dissipation for the LED chip, wherein the first group of TSVs are arranged in a first pattern with a first pattern density and the second group of TSVs are arranged in a second pattern with a second pattern density, and wherein the first and the second groups of TSVs all have a same depth and the first pattern of the first group of TSVs and the second pattern of the second group of TSVs are the same.

2. The package of claim 1, wherein the first group of TSVs and the second group of TSVs have significantly same shapes, significantly same sizes, and significantly same aspect ratios.

3. The package of claim 1, wherein first pattern density of the first group of TSVs and the second pattern density of the second group of TSVs are significantly the same.

4. The package of claim 1, wherein the first group of TSVs and the second group of TSVs all have a cross-sectional shape selected from a group consisting of circle, oval, square, rectangle, triangle, hexagonal, and octagonal.

5. The package of claim 1, wherein each of the first pattern density and the second pattern density is between about 25% to about 60%.

6. The package of claim 1, wherein absolute value of a difference between the first pattern density and the second pattern density has an absolute value between about 0.1% to about 5%.

7. The package of claim 6, wherein the first pattern density is higher than the second pattern density to reduce the edge effect of the first group of TSVs.

8. The package of claim 1, wherein the second group of TSVs also provide electrical connection for the LED.

9. The package of claim 1, wherein the second group of TSVs are disposed below the LED.

10. The package of claim 1, wherein aspect ratio of each of the first group of TSVs and second group of TSVs is between about 3 to about 10.

11. The package of claim 1, wherein a width of each of the first group of TSVs and the second group of TSVs is between about 15 μm to about 40 and wherein the depth of each of the first group of TSVs and the second group of TSVs is between about 30 μm to about 400 μm.

12. A semiconductor device comprising:
    the semiconductor device; and
    a support structure, wherein the semiconductor device is disposed on the support structure, and wherein the support structure has a first group of through silicon vias (TSVs) for providing electrical connection for the semiconductor device and a second group of TSVs for providing a function of heat dissipation for the semiconductor device, wherein the first group of TSVs are arranged in a first pattern with a first pattern density and the second group of TSVs are arranged in a second pattern with a second pattern density, and wherein the first and the second groups of TSVs all have a same depth and an absolute value of a difference between the first pattern density and the second pattern density has an absolute value between about 0.1% to about 5%.

13. The semiconductor device of claim 12, wherein the second group of TSVs is positioned between a first portion of the first group of TSVs and a second portion of the first group of TSVs.

14. The semiconductor device of claim 12, wherein a distance between TSVs within the first group of TSVs and within the second group of TSVs is equal to a diameter of the TSVs.

15. The semiconductor device of claim 12, wherein the first group of TSVs includes at least two first columns of TSVs, the second group of TSVs includes at least one second column of TSVs, and the at least two first columns of TSVs are arranged in alternating fashion with the at least one second column of TSVs.

16. The semiconductor device of claim 15, wherein the at least one second column of TSVs is offset from the at least two first columns of TSVs in a direction perpendicular to a line connecting the at least two first columns of TSVs.

17. The semiconductor device of claim 12, wherein a distance between the first group of TSVs and the second group of TSVs is greater than a distance between TSVs within the second group of TSVs.

18. The semiconductor device of claim 12, wherein a number of TSVs in the second group of TSVs is greater than a number of TSVs in the first group of TSVs.

19. The semiconductor device of claim 12, wherein the first group of TSVs are connected to an electrical interface, and the second group of TSVs are connected to a thermal interface separate from the electrical interface.

20. A semiconductor device comprising:
    the semiconductor device; and
    a support structure, wherein the semiconductor device is disposed on the support structure, and wherein the support structure has a first group of through silicon vias (TSVs) connected to an electrical interface for providing electrical connection for the semiconductor device and a second group of TSVs connected to a thermal interface for providing a function of heat dissipation for the semiconductor device, wherein the thermal interface is separate from the electrical interface, the first group of TSVs are arranged in a first pattern with a first pattern density and the second group of TSVs are arranged in a second pattern with a second pattern density, and the first and the second groups of TSVs all have a same depth.

* * * * *